United States Patent
Cheng et al.

(10) Patent No.: US 9,583,618 B2
(45) Date of Patent: Feb. 28, 2017

(54) METAL OXIDE SEMICONDUCTOR FIELD EFFECT TRANSISTOR HAVING ASYMMETRIC LIGHTLY DOPED DRAIN REGIONS

(71) Applicant: TAIWAN SEMICONDUCTOR MANUFACTURING COMPANY, LTD., Hsinchu (TW)

(72) Inventors: Chih-Chang Cheng, Hsinchu (TW); Fu-Yu Chu, Hsinchu (TW); Ruey-Hsin Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 282 days.

(21) Appl. No.: 13/928,971

(22) Filed: Jun. 27, 2013

(65) Prior Publication Data
US 2015/0001636 A1   Jan. 1, 2015

(51) Int. Cl.
*H01L 29/78* (2006.01)
*H01L 29/66* (2006.01)
*H01L 27/06* (2006.01)
H01L 21/8234 (2006.01)
H01L 21/265 (2006.01)
H01L 29/10 (2006.01)

(52) U.S. Cl.
CPC .... *H01L 29/7835* (2013.01); *H01L 29/66492* (2013.01); *H01L 29/66659* (2013.01); *H01L 21/26513* (2013.01); *H01L 21/823418* (2013.01); *H01L 29/1045* (2013.01)

(58) Field of Classification Search
CPC .......... H01L 29/7835; H01L 29/66492; H01L 27/0617
See application file for complete search history.

(56) References Cited

U.S. PATENT DOCUMENTS

| | | | | |
|---|---|---|---|---|
| 4,962,052 A | * | 10/1990 | Asayama | H01L 21/8249 257/296 |
| 5,340,756 A | * | 8/1994 | Nagayasu | H01L 21/823468 257/E21.626 |
| 5,606,192 A | * | 2/1997 | Harada | H01L 27/0623 257/377 |
| 6,538,287 B2 | * | 3/2003 | Wang | H01L 27/1085 257/350 |
| 6,777,723 B1 | * | 8/2004 | Narita | H01L 27/0259 257/173 |
| 6,913,964 B2 | * | 7/2005 | Hsu | H01L 27/108 257/E21.654 |
| 7,405,117 B2 | | 7/2008 | Zuniga et al. | |
| 7,683,427 B2 | * | 3/2010 | Chen et al. | 257/343 |
| 7,910,984 B2 | * | 3/2011 | Yamaguchi et al. | 257/328 |
| 8,410,549 B2 | * | 4/2013 | Bulucea | H01L 21/26513 257/336 |

(Continued)

*Primary Examiner* — Ida M Soward
(74) *Attorney, Agent, or Firm* — Hauptman Ham, LLP

(57) ABSTRACT

A metal-oxide-semiconductor field effect transistor (MOSFET) includes a substrate and a gate structure over a top surface of the substrate. The MOSFET further includes a source in the substrate on a first side of the gate structure and a drain in the substrate on a second side of the gate structure opposite the first side. A surface portion of the substrate extending from the source to the drain has an asymmetric dopant concentration profile.

20 Claims, 16 Drawing Sheets

(56) References Cited

U.S. PATENT DOCUMENTS

| | | | | |
|---|---|---|---|---|
| 8,415,752 B2* | 4/2013 | Yang | H01L 21/26513 | 257/408 |
| 8,891,213 B2* | 11/2014 | Liu | H01L 27/0259 | 361/111 |
| 2009/0003074 A1* | 1/2009 | Georgescu | G11C 16/0433 | 365/185.18 |
| 2009/0014791 A1* | 1/2009 | Anderson et al. | | 257/337 |
| 2009/0294816 A1* | 12/2009 | Park | H01L 27/14603 | 257/292 |
| 2010/0102388 A1* | 4/2010 | Levin et al. | | 257/343 |
| 2010/0109081 A1* | 5/2010 | Chen et al. | | 257/336 |
| 2010/0255647 A1* | 10/2010 | Yamakoshi | H01L 27/11546 | 438/211 |
| 2011/0133818 A1* | 6/2011 | Matsudai | H01L 29/1083 | 327/534 |
| 2012/0326783 A1* | 12/2012 | Mathe et al. | | 330/251 |
| 2013/0045577 A1* | 2/2013 | Huang | H01L 21/82385 | 438/225 |
| 2013/0270636 A1* | 10/2013 | Ito | H01L 29/7835 | 257/336 |
| 2013/0335054 A1* | 12/2013 | Pigott et al. | | 323/311 |
| 2014/0035102 A1* | 2/2014 | Korec | H01L 27/082 | 257/566 |
| 2014/0097811 A1* | 4/2014 | Yang et al. | | 323/271 |
| 2014/0179080 A1* | 6/2014 | Chung et al. | | 438/286 |
| 2014/0339636 A1* | 11/2014 | Hsu et al. | | 257/343 |
| 2015/0061619 A1* | 3/2015 | Tang et al. | | 323/271 |

\* cited by examiner

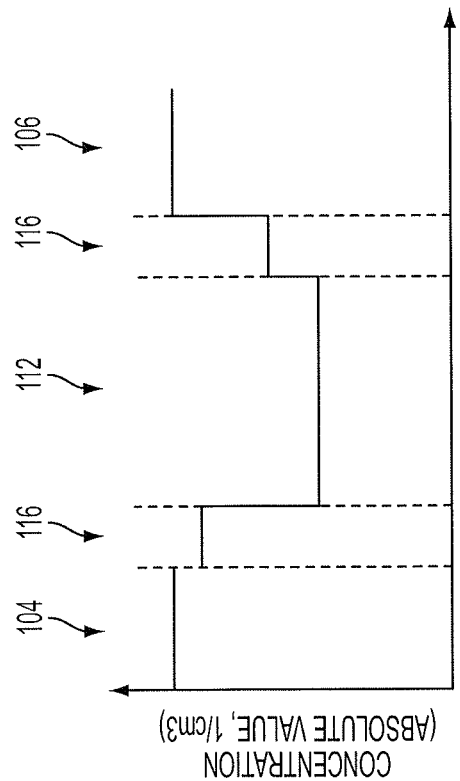
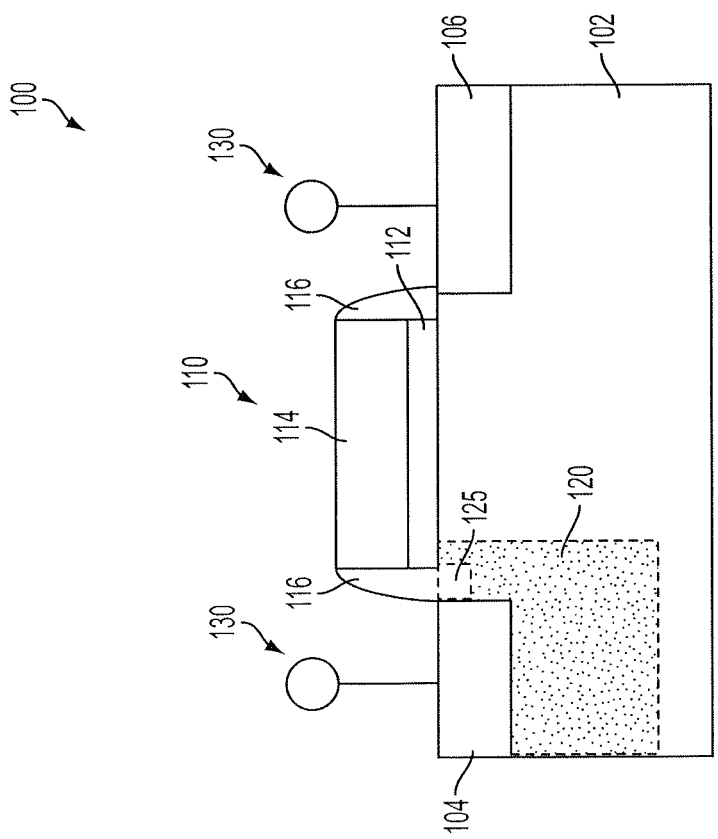
FIG. 1B
FIG. 1A

METAL OXIDE SEMICONDUCTOR FIELD EFFECT TRANSISTOR HAVING ASYMMETRIC LIGHTLY DOPED DRAIN REGIONS

BACKGROUND

A metal oxide semiconductor field effect transistor (MOSFET) which includes lightly doped drain (LDD) regions includes a capacitance formed between a gate electrode and LDD regions on source and drain sides of the MOSFET. Spacer layers formed over sidewalls of the gate electrode act as an insulating material between the conductive features of the gate electrode and the LDD regions. A first capacitor Cgs is formed between the gate electrode and the LDD region on the source side of the MOSFET, and a second capacitor Cgd is formed between the gate electrode and the LDD region on the drain side of the MOSFET.

An amount of capacitance in the first capacitor Cgs and the second capacitor Cgd is determined by a dopant concentration in the LDD regions and by an amount of overlap of the LDD regions with the gate electrode. As the dopant concentration of the LDD regions increases, a conductivity of the LDD regions increases resulting in an increase in capacitance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIG. 1A is a cross-sectional view of a MOSFET in accordance with one or more embodiments;

FIG. 1B is a dopant concentration profile across the MOSFET of FIG. 1A in accordance with one or more embodiments;

DETAILED DESCRIPTION

Figure 2:
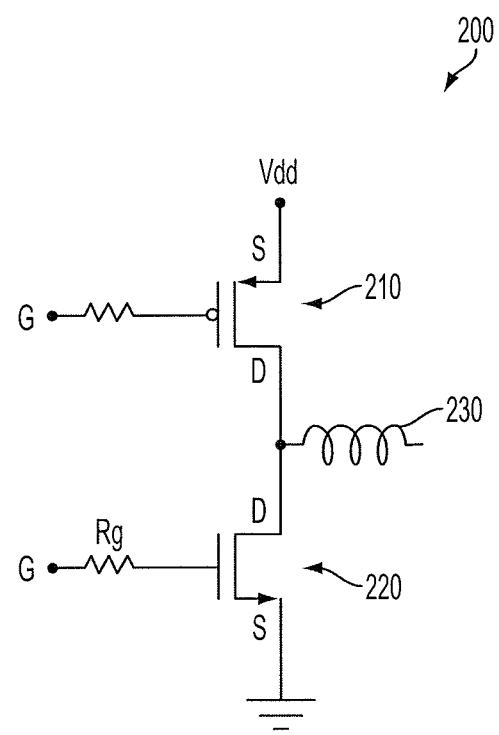
FIG. 2 is a schematic diagram of a converter including the MOSFET of FIG. 1A in accordance with one or more embodiments.

The following disclosure provides many different embodiments, or examples, for implementing different features of the invention. Specific examples of components and arrangements are described below to simplify the present disclosure. These are examples and are not intended to be limiting.

FIG. 1A is a cross-sectional view of a metal oxide semiconductor field effect transistor (MOSFET) 100 in accordance with one or more embodiments. MOSFET 100 includes a substrate 102 a source region 104 in the substrate and a drain region 106 in the substrate. MOSFET 100 further includes a gate structure 110 over substrate 102 positioned between source region 104 and drain region 106. Gate structure 110 includes a gate dielectric 112 over substrate 102 and a gate electrode 114 over the gate dielectric. Gate structure 110 also includes spacers 116 over substrate 102 covering sidewalls of gate dielectric 112 and gate electrode 114. MOSFET 100 also includes contacts 130 configured to provide electrical signals to source region 104 and drain region 106. In some embodiments, MOSFET 100 includes a doped body 120 in substrate 102. Doped body 120 extends from source region 102 under spacer 116 and under a portion of gate dielectric 112. Doped body also extends below source region 104 in substrate 102. In some embodiments, MOSFET 100 includes a lightly doped drain (LDD) region 125 extending from source region 104 under spacer 116.

In some embodiments, substrate 102 comprises an elementary semiconductor including silicon or germanium in a crystal, a polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 102 is a doped substrate. In some embodiments, substrate 102 is a high resistance substrate.

Source region 104 and drain region 106 are areas of higher charge mobility within substrate 102. In some embodiments, source region 104 and drain region 106 have higher hole mobility than substrate 102. In some embodiments, source region 104 and drain region 106 have higher electron mobility than substrate 102. In some embodiments, source region 104 and drain region 106 include various doping configurations depending on design requirements. In some embodiments, source region 104 and drain region 106 are doped with p-type or n-type dopants. For example, source region 104 and drain region 106 are doped with p-type dopants, such as boron or $BF_2$; n-type dopants, such as phosphorus or arsenic; and/or combinations thereof. In some embodiments, source region 104 and drain region 106 are configured for an N-type metal-oxide-semiconductor transistor (referred to as an NMOS) or for a P-type metal-oxide-semiconductor transistor (referred to as a PMOS).

Gate dielectric layer 112 is positioned between gate electrode 114 and substrate 102. In some embodiments, gate dielectric layer 112 is formed by a thermal oxidation, nitridation, sputter deposition, chemical vapor deposition, a combination thereof, or another suitable formation process.

In some embodiments, gate dielectric layer 112 comprises silicon oxide, silicon nitride, nitrided silicon oxide, silicon oxynitride, and high-K (for example, a K>8) dielectrics. The high-K dielectrics include metal oxides, metal silicates, metal nitrides, transition metal-oxides, transition metal silicates, metal aluminates, and transition metal nitrides, or combinations thereof. For example, in some embodiments, the high-K dielectrics include, but are not limited to, one or more of aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

Gate electrode layer 114 is configured to receive a control signal to selectively activate and deactivate charge transfer between source region 104 and drain region 106. In some embodiments, gate electrode layer 114 comprises doped polysilicon and/or metal. In some embodiments, gate electrode layer 114 comprises polysilicon, doped polysilicon, amorphous polysilicon, polysilicon-germanium, combinations thereof, or, in some embodiments, the gate electrode layer 114 includes another suitable conductive material.

Spacers 116 are configured to electrically insulate gate electrode layer 114. In some embodiments, spacers 116 are formed by a wet etching process, a dry etching process, or combinations thereof. In some embodiments, the dry etching process is an anisotropic dry etching process.

Contacts 130 are configured to provide electrical signals to source region 104 or drain region 106. In some embodiments, contacts 130 comprise conductive vias to provide electrical connection between source region 104 and drain region 106 and an interconnect structure. In some embodiments, the conductive vias comprise copper, aluminum, tungsten or another suitable conductive material. In some embodiments, contacts 130 comprise a silicide layer over source region 104 or drain region 106.

Doped body 120 has an higher dopant concentration in comparison with substrate 102, but a lower dopant concentration that source region 104. In some embodiments, doped body 120 has a dopant type opposite to a dopant type of drain region 106. In some embodiments, doped body 120 is formed during a self-align process. In some embodiments, doped body 120 is formed using a single implantation operation. In some embodiments, doped body 120 is formed using multiple implantation operations. In some embodiments, the multiple implantation operations use different dopant types and/or different implantation energies. In some embodiments, a dopant concentration in a surface portion of doped body 120 adjacent a top surface of substrate 102 ranges from about $1 \times 10^{14}$ ions/$cm^3$ to about $1 \times 10^{17}$ ions/$cm^3$. In some embodiments, a depth of the doped body ranges from about 0.01 microns to about 0.3 microns.

LDD region 125 has a higher dopant concentration than substrate 102, but a lower dopant concentration than source region 104. LDD region 125 is formed in a portion of substrate 102 under spacer 116 which is adjacent to source region 104. In some embodiments, MOSFET 100 includes an additional LDD region under spacer 116 adjacent to drain region 106; however, the additional LDD region has a lower dopant concentration than LDD region 125. In some embodiments, LDD region 125 is formed by an ion implantation process. A dopant type of LDD region 125 is a same dopant type as that used in drain region 106. In some embodiments, a dopant concentration in LDD region 125 ranges from about $1 \times 10^{14}$ ions/$cm^3$ to about $1 \times 10^{17}$ ions/$cm^3$.

FIG. 1B is a surface dopant concentration profile 150 across MOSFET 100 in accordance with one or more embodiments. Dopant concentration profile 150 indicates that a dopant concentration under spacer 116 adjacent to source region 104 is higher than a dopant concentration under spacer 116 adjacent to drain region 106. In some embodiments, the dopant concentration under spacer 116 adjacent to source region 104 is about 10 times to about 100 times greater than the dopant concentration under spacer 116 adjacent to drain region 106. In some embodiments, a dopant concentration under spacer 116 adjacent to drain region 106 ranges from about $1 \times 10^{13}$ ions/$cm^3$ to about $1 \times 10^{15}$ ions/$cm^3$.

A first capacitance Cgs and a second capacitance Cgd impact gate bounce induced shoot-through in a power management integrated circuit (PMIC). Gate bounce is an increase in a voltage applied to a gate of MOSFET 100 during switching on of the MOSFET. If the gate bounce results in the voltage applied to gate structure 110 of MOSFET 100 exceeding a break-down voltage of the MOSFET, gate dielectric layer 112 of the MOSFET will be damaged. The first capacitance Cgs and the second capacitance Cgd also impact a switching loss during operation of MOSFET 100.

The dopant concentration under spacer 116 adjacent to source region 104 impacts a first capacitance (Cgs) between gate electrode 114 and the source region 104. Similarly, the dopant concentration under spacer 116 adjacent to drain region 106 impacts a capacitance (Cgd) between gate electrode 114 and the drain region. In some power management integrated circuits (PMICs), such as buck converters, a higher Cgs is used to reduce a risk of gate bounce induced shoot-through. Gate bounce induced shoot-through is an unintentional turning-on of the channel of a MOSFET due to a voltage swing at a gate of the MOSFET. In contrast a lower Cgd helps to reduce switching loss. The switching loss impacts the power dissipated by the MOSFET. If the power dissipation is too great, the MOSFET fails, in some instances, and potentially damages surrounding circuitry.

The asymmetric character of dopant concentration, such as that of profile 150, makes it possible to achieve an advantage in that the risk of gate bounce induced shoot through is reduced by having a higher Cgs, while switching loss is reduced by having a low Cgd. Thus, MOSFET 100 having dopant concentration profile 150 exhibits better performance than a MOSFET having a symmetrical dopant concentration profile.

FIG. 2 is a schematic diagram of a converter 200 including MOSFET 100 in accordance with one or more embodiments. Converter 200 includes a high side transistor 210 configured to receive a supply voltage Vdd. Converter 200 further includes a low side transistor 220 configured to connect to a ground voltage. An inductor 230 is connected to a node positioned between high side transistor 210 and low side transistor 220. High side transistor 210 is a p-type metal oxide semiconductor (PMOS) transistor. In some embodiments, high side transistor 210 is an n-type metal oxide semiconductor (NMOS) transistor. Low side transistor 220 is an NMOS transistor. In some embodiments, where high side transistor 210 is an NMOS transistor, converter 200 has a smaller physical size due to increased electron mobility in the NMOS transistor in comparison with the PMOS transistor.

In some embodiments, converter 200 is configured as a buck converter. In some embodiments where converter 200 is a buck converter, the converter is used as a direct current (DC) to DC step down converter to reduce a received DC voltage to a lower voltage level. Inductor 230 is configured to minimize a change in current while changing a voltage which converter 200 supplies to a load. In some embodiments, converter 200 is a part of a PMIC.

Figure 3A:
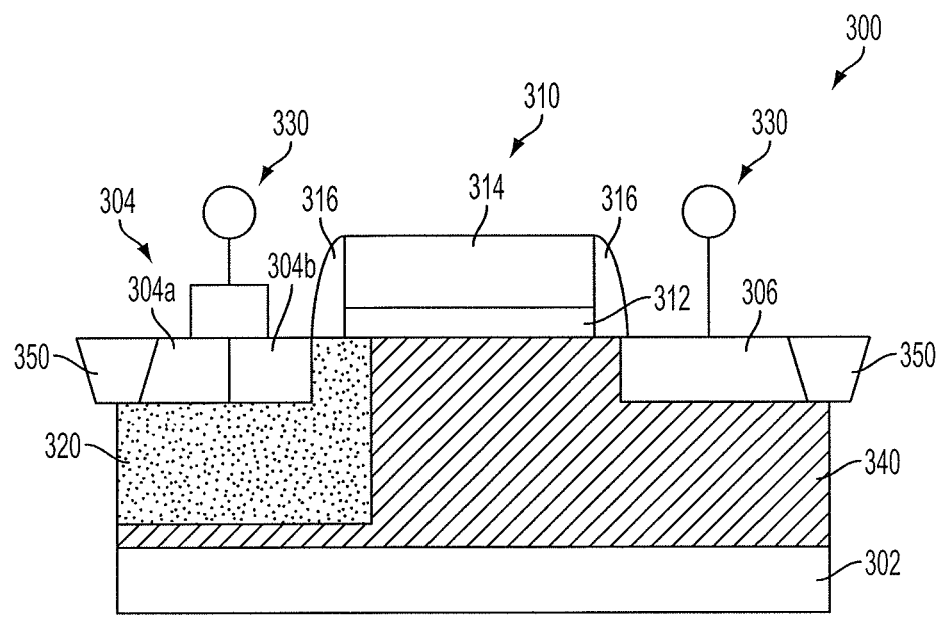
FIGS. 3A-3E are cross-sectional views of n-type MOSFET (NMOS) devices in accordance with one or more embodiments.

FIG. 3A is a cross-section view of an NMOS device 300 in accordance with one or more embodiments. In some embodiments, NMOS device 300 is configured to be a low side transistor, e.g., low side transistor 220. NMOS device 300 comprises a substrate 302, a source region 304 in the substrate and a drain region 306 in the substrate. Source region 304 is separated into a p-type doped source region 304a and an n-type doped source region 304b. A gate structure 310 is positioned on substrate 302 between source region 304 and drain region 306. Gate structure 310 includes a gate dielectric layer 312 over substrate 302, a gate electrode layer 314 over the gate dielectric layer and spacers 316 on the substrate covering sidewalls of the gate dielectric layer and the gate electrode layer. NMOS device 300 also includes contacts 330 configured to provide electrical signals to source region 304 and drain region 306. NMOS device 300 also includes a p-type doped body 320 in substrate 302. P-type doped body 320 extends from source region 304 under spacer 316 and under a portion of gate dielectric layer 312. P-type doped body 320 extends below source region 304 in substrate 302. NMOS device 300 further includes a p-well 340 in substrate 302. P-well 340 surrounds p-type doped body 320, source region 304 and drain region 306. P-well 340 extends between p-type doped body 320 and drain region 306. NMOS device 300 further includes isolation regions 350 in substrate 302 configured to electrically separate NMOS device 300 from adjacent circuitry.

Substrate 302, source region 304, drain region 306, gate structure 310, and contacts 330 are similar to substrate 102, source region 104, drain region 106, gate structure 110, and contacts 130, respectively. P-type doped body 320 comprises p-type dopants. In some embodiments, the p-type dopants include at least one of boron, boron di-fluoride ($BF_2$), or another suitable p-type dopant. In some embodiments, p-type doped body 320 also includes n-type dopants, such as arsenic, phosphorous, or another suitable n-type dopant. In some embodiments, p-type doped body 320 is formed using a single implantation process. In some embodiments, p-type doped body 320 is formed using multiple implantation processes.

An example of a multiple implantation process for forming p-type doped body 320 includes a first implantation using an n-type dopant, such as arsenic. The first implantation includes a dopant concentration ranging from about $5 \times 10^{12}$ ions/$cm^3$ to about $1 \times 10^{15}$ ions/$cm^3$. An energy of the first implantation process ranges from about 2 kilo electron volts (kEv) to about 60 kEv. A second implantation process uses a p-type dopant, such as boron or $BF_2$, at a dopant concentration ranging from about $1 \times 10^{12}$ ions/$cm^3$ to about $1 \times 10^{14}$ ions/$cm^3$. An implantation energy of the second implantation process ranges from about 5 kEv to about 120 kEv. The implantation energy of the second implantation is higher than the implantation energy of the first implantation process. A third implantation process uses a p-type dopant, such as boron, at a dopant concentration ranging from about $1 \times 10^{12}$ ions/$cm^3$ to about $1 \times 10^{14}$ ions/$cm^3$. An implantation energy of the third implantation process ranges from about 10 kEv to about 300 kEv. The implantation energy of the third implantation process is higher than the implantation energy of the second implantation process. In some embodiments, a dopant used for the second implantation process is a same dopant as that used in the third implantation process.

In some embodiments, a dopant used for the second implantation process is different from that used in the third implantation process.

In some embodiments, p-type doped body 320 is formed by a self-aligned process in which gate dielectric layer 312 and gate electrode layer 314 are used as part of a mask during the implantation process(es) for forming p-type doped body 320.

P-well 340 is in substrate 102 surrounding p-type doped body 320, source region 304 and drain region 306. P-well 340 includes a p-type dopant. In some embodiments, the p-type dopant comprises boron, $BF_2$, aluminum or other suitable p-type dopants. In some embodiments, p-well 340 comprises an epi-layer grown on substrate 302. In some embodiments, the epi-layer is doped by adding dopants during the epitaxial process. In some embodiments, the epi-layer is doped by ion implantation after the epi-layer is formed. In some embodiments, p-well 340 is formed by doping substrate 302. In some embodiments, the doping is performed by ion implantation. In some embodiments, p-well 340 has a dopant concentration ranging from $1 \times 10^{12}$ atoms/$cm^3$ to $1 \times 10^{14}$ atoms/$cm^3$.

Isolation regions 350 electrically separate NMOS device 300 from surrounding circuitry. In some embodiments, isolation regions 350 are isolation features, such as shallow trench isolation (STI), local oxidation of silicon (LOCOS), or other suitable isolation features. In some embodiments, isolation regions 350 are undoped portions of substrate 302. In some embodiments, isolation regions 350 are formed by etching substrate 302 to form an opening and filling the opening with non-conductive material.

NMOS device 300 includes an asymmetric dopant profile due to the lack of a doped region under spacer 316 adjacent drain region 306. In some embodiments, NMOS device 300 includes a very low dopant concentration under spacer 316 adjacent drain region 306. A dopant concentration under spacer 316 adjacent drain region 306 is about 10 to about 100 times less than a dopant concentration under spacer 316 adjacent source region 304.

Figure 3B:
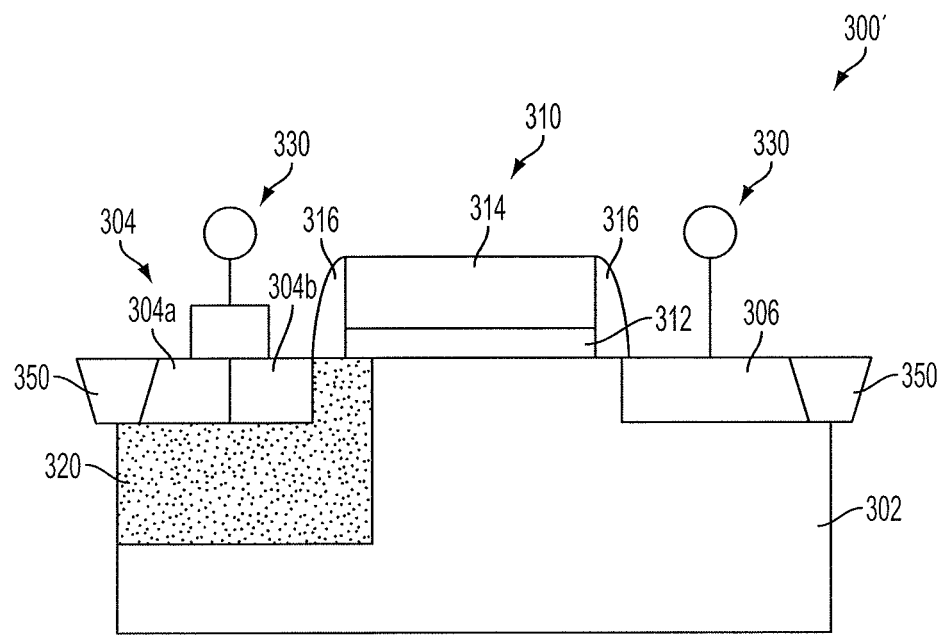

FIG. 3B is a cross-section view of an NMOS device 300' in accordance with one or more embodiments. In some embodiments, NMOS device 300' is configured to be a low side transistor, e.g., low side transistor 220. NMOS device 300' comprises a substrate 302, a source region 304 in the substrate and a drain region 306 in the substrate. Source region 304 is separated into a p-type doped source region 304a and an n-type doped source region 304b. A gate structure 310 is positioned on substrate 302 between source region 304 and drain region 306. Gate structure 310 includes a gate dielectric layer 312 over substrate 302, a gate electrode layer 314 over the gate dielectric layer and spacers 316 on the substrate covering sidewalls of the gate dielectric layer and the gate electrode layer. NMOS device 300' also includes contacts 330 configured to provide electrical signals to source region 304 and drain region 306. NMOS device 300' also includes a p-type doped body 320 in substrate 302. P-type doped body 320 extends from source region 304 under spacer 316 and under a portion of gate dielectric layer 312. P-type doped body 320 extends below source region 304 in substrate 302. NMOS device 300' further includes isolation regions 350 in substrate 302 configured to electrically separate NMOS device 300 from adjacent circuitry. NMOS device 300' is different from NMOS device 300 in that NMOS device 300' does not include p-well 340.

NMOS device 300' includes an asymmetric dopant profile due to the lack of a doped region under spacer 316 adjacent drain region 306. In some embodiments, NMOS device 300' includes a lower dopant concentration under spacer 316 adjacent drain region 306. A dopant concentration under spacer 316 adjacent drain region 306 is about 10 to about 100 times less than a dopant concentration under spacer 316 adjacent source region 304.

Figure 3C:
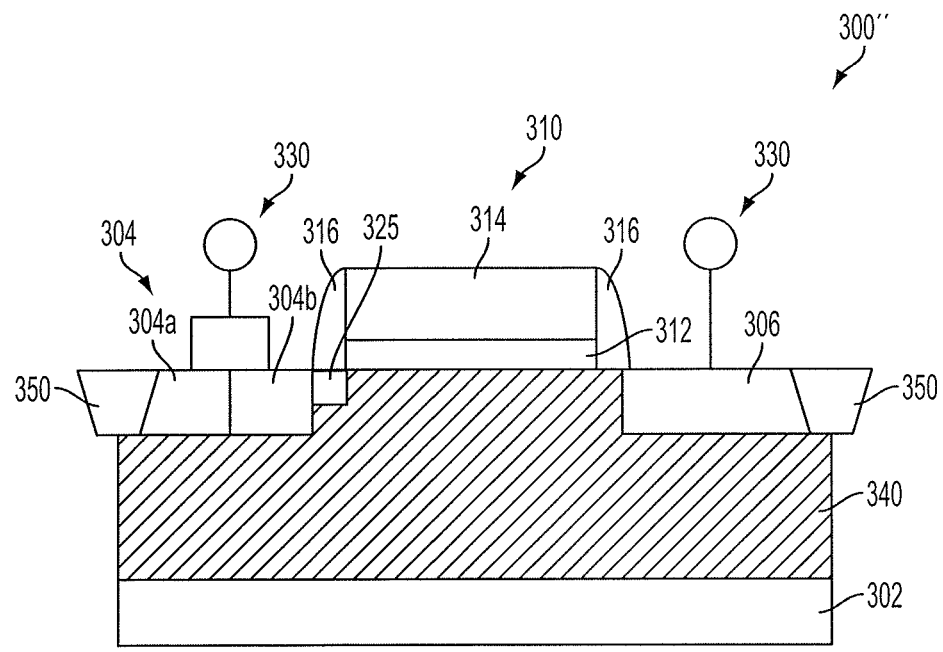

FIG. 3C is a cross-section view of an NMOS device 300" in accordance with one or more embodiments. In some embodiments, NMOS device 300" is configured to be a low side transistor, e.g., low side transistor 220. NMOS device 300" comprises a substrate 302, a source region 304 in the substrate and a drain region 306 in the substrate. Source region 304 is separated into a p-type doped source region 304a and an n-type doped source region 304b. A gate structure 310 is positioned on substrate 302 between source region 304 and drain region 306. Gate structure 310 includes a gate dielectric layer 312 over substrate 302, a gate electrode layer 314 over the gate dielectric layer and spacers 316 on the substrate covering sidewalls of the gate dielectric layer and the gate electrode layer. NMOS device 300" includes an LDD region 325 extending from source region 304 under spacer 316 adjacent the source region. NMOS device 300" also includes contacts 330 configured to provide electrical signals to source region 304 and drain region 306. NMOS device 300" also includes a p-well 340 in substrate 302. P-well 340 surrounds source region 304 and drain region 306 and extends beneath gate dielectric layer 312. NMOS device 300" further includes isolation regions 350 in substrate 302 configured to electrically separate NMOS device 300 from adjacent circuitry. NMOS device 300" is different from NMOS device 300 in that NMOS device 300" does not include p-type doped body 320, but does include LDD region 325.

In some embodiments, LDD region 325 is formed by an ion implantation process. A dopant type of LDD region 325 is an n-type dopant. In some embodiments, a dopant concentration in LDD region 325 ranges from about $1\times10^{14}$ ions/cm$^3$ to about $1\times10^{17}$ ions/cm$^3$, LDD region 325 extends under spacer 316, but does not extend under gate dielectric layer 312.

LDD region 325 is formable by a non-self aligned process. In some embodiments, an anneal process follows the ion implantation process. In some embodiments, to minimize significant diffusion of dopants, such as boron, arsenic, phosphorus, etc., the peak anneal temperature should be equal to or less than about 1010° C. for rapid thermal anneal (RTA). In some embodiments, the peak anneal temperature is equal to or less than about 900° C. The duration of such RTA, or rapid thermal processing (RTP) anneal, is affected by the anneal temperature. For a higher anneal temperature, the anneal time is kept lower. In some embodiments, the RTA duration is equal to or less than about 60 seconds. For example, the anneal process is performed at a temperature in a range from about 750° C. to about 850° C. for a duration in a range from about 5 seconds to about 60 seconds, in accordance with some embodiments. If millisecond anneal (or flash anneal) is used, the peak anneal temperature is higher than the RTA temperature and the duration is reduced. In some embodiments, the peak anneal temperature is equal to or less than about 1250° C. The duration of the millisecond anneal is equal to or less than about 40 milliseconds, in accordance with some embodiments.

NMOS device 300" includes an asymmetric dopant profile due to the lack of a doped region under spacer 316 adjacent drain region 306. In some embodiments, NMOS device 300" includes a very low dopant concentration under spacer 316 adjacent drain region 306. A dopant concentration under spacer 316 adjacent drain region 306 is about 10 to about 100 times less than a dopant concentration under spacer 316 adjacent source region 304.

Figure 3D:
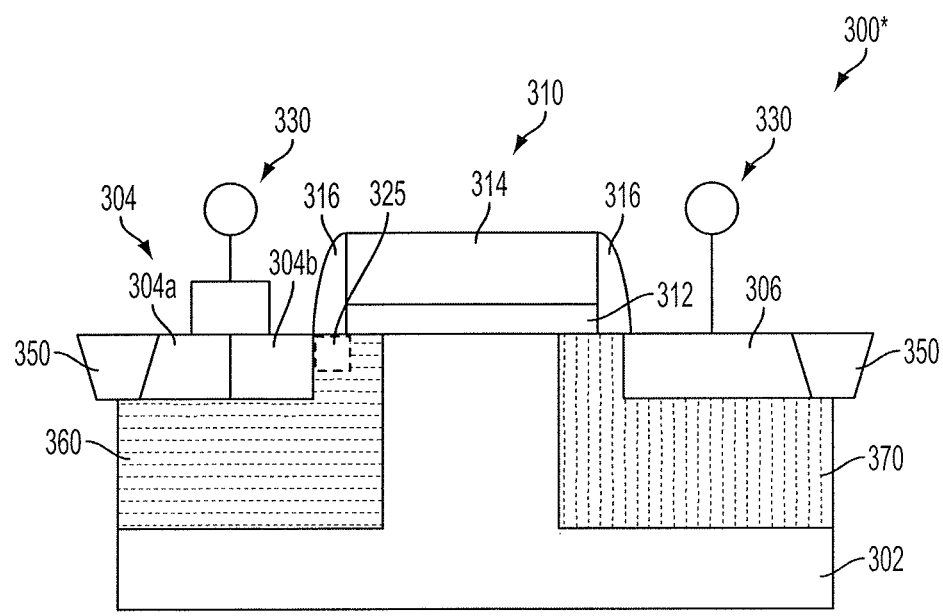

FIG. 3D is a cross-section view of an NMOS device 300* in accordance with one or more embodiments. In some embodiments, NMOS device 300* is configured to be a low side transistor, e.g., low side transistor 220. NMOS device 300* comprises a substrate 302, a source region 304 in the substrate and a drain region 306 in the substrate. Source region 304 is separated into a p-type doped source region 304a and an n-type doped source region 304b. A gate structure 310 is positioned on substrate 302 between source region 304 and drain region 306. Gate structure 310 includes a gate dielectric layer 312 over substrate 302, a gate electrode layer 314 over the gate dielectric layer and spacers 316 on the substrate covering sidewalls of the gate dielectric layer and the gate electrode layer. NMOS device 300* also includes contacts 330 configured to provide electrical signals to source region 304 and drain region 306. NMOS device 300* also includes a p-well 360 in substrate 302. P-well 340 surrounds source region 304 and extends beneath gate dielectric layer 312. NMOS device 300* also includes an n-well 370 in substrate 302. N-well 340 surrounds drain region 306 and extends beneath gate dielectric layer 312. NMOS device 300* further includes isolation regions 350 in substrate 302 configured to electrically separate NMOS device 300 from adjacent circuitry. NMOS device 300* is different from NMOS device 300 in that NMOS device 300* does not include p-type doped body 320, but does include p-well 360 and n-well 370. In some embodiments, NMOS device 300* further includes an LDD region 325 extending from source region 304 under spacer 316 adjacent the source region.

In some embodiments, p-well 360 is formed by an ion implantation process. In some embodiments, a dopant concentration in p-well 360 ranges from about $1\times10^{15}$ m ions/cm$^3$ $1\times10^{18}$ ions/cm$^3$. P-well 360 extends under spacer 316 and under gate dielectric layer 312.

In some embodiments, n-well 370 is formed by an ion implantation process. In some embodiments, a dopant concentration in n-well 370 ranges from about $1\times10^{14}$ ions/cm$^3$ to about $1\times10^{17}$ ions/cm$^3$. N-well 370 extends under spacer 316 and under gate dielectric layer 312.

P-well 360 and n-well 370 are formed by a non-self aligned process. A gap between p-well 360 and n-well 370 includes an undoped or lightly doped portion of substrate 302. The gap is less than a length of gate dielectric layer 312. In some embodiments, p-well 360 contacts n-well 370 and the gap is omitted. In some embodiments, an anneal process follows the ion implantation process. To minimize significant diffusion of dopants, such as boron, BF$_2$, etc., the peak anneal temperature should be equal to or less than about 1010° C. for rapid thermal anneal (RTA). The duration of such RTA, or rapid thermal processing (RIP) anneal, is affected by the anneal temperature. For a higher anneal temperature, the anneal time is kept lower. In some embodiments, the RTA duration is equal to or less than about 60 seconds. For example, the anneal process is performed at a temperature in a range from about 750° C. to about 850° C. for a duration in a range from about 5 seconds to about 60 seconds, in accordance with some embodiments. If millisecond anneal (or flash anneal) is used, the peak anneal temperature is higher than the RTA temperature and the duration is reduced. In some embodiments, the peak anneal temperature is equal to or less than about 1250° C. The duration of the millisecond anneal is equal to or less than about 40 milliseconds, in accordance with some embodiments.

NMOS device 300* includes an asymmetric dopant profile due to the lack of a doped region under spacer 316 adjacent drain region 306. In some embodiments, NMOS device 300* includes a very low dopant concentration under spacer 316 adjacent drain region 306. A dopant concentration under spacer 316 adjacent drain region 306 is about 10 to about 100 times less than a dopant concentration under spacer 316 adjacent source region 304.

Figure 3E:
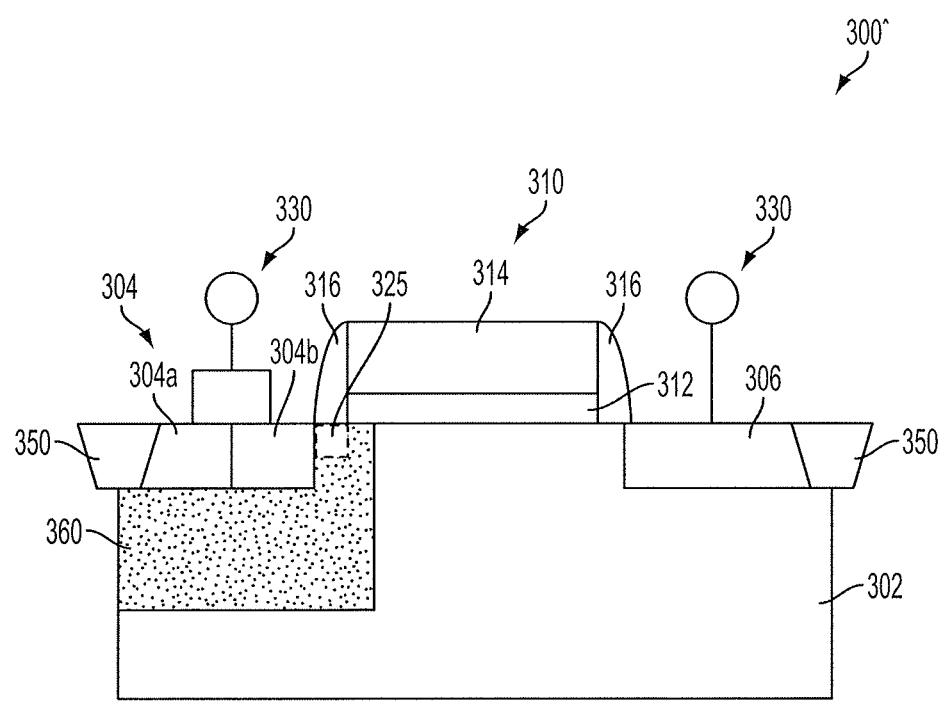

FIG. 3E is a cross-section view of an NMOS device 300^ in accordance with one or more embodiments. In some embodiments, NMOS device 300^ is configured to be a low side transistor, e.g., low side transistor 220. NMOS device 300^ comprises a substrate 302, a source region 304 in the substrate and a drain region 306 in the substrate. Source region 304 is separated into a p-type doped source region 304a and an n-type doped source region 304b. A gate structure 310 is positioned on substrate 302 between source region 304 and drain region 306. Gate structure 310 includes a gate dielectric layer 312 over substrate 302, a gate electrode layer 314 over the gate dielectric layer and spacers 316 on the substrate covering sidewalls of the gate dielectric layer and the gate electrode layer. NMOS device 300^ also includes contacts 330 configured to provide electrical signals to source region 304 and drain region 306. NMOS device 300^ also includes a p-well 360 in substrate 302. P-well 340 surrounds source region 304 and extends beneath gate dielectric layer 312. NMOS device 300^ further includes isolation regions 350 in substrate 302 configured to electrically separate NMOS device 300 from adjacent circuitry. NMOS device 300^ differs from NMOS device 300 in that NMOS device 300^ does not include p-type doped body 320, but does include p-well 360. In some embodiments, NMOS device 300^ further includes an LDD region 325 extending from source region 304 under spacer 316 adjacent the source region.

NMOS device 300^ includes an asymmetric dopant profile due to the lack of a doped region under spacer 316 adjacent drain region 306. In some embodiments, NMOS device 300^ includes a very low dopant concentration under spacer 316 adjacent drain region 306. A dopant concentration under spacer 316 adjacent drain region 306 is about 10 to about 100 times less than a dopant concentration under spacer 316 adjacent source region 304.

Figure 4A:
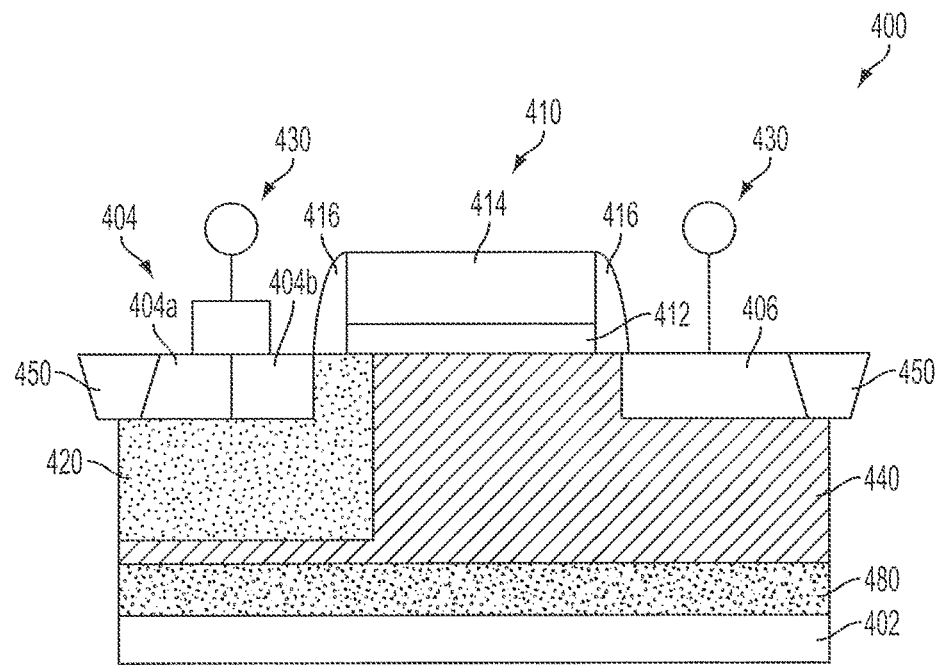
FIGS. 4A-4F are cross-sectional views of n-type MOSFET (NMOS) devices in accordance with one or more embodiments.

FIG. 4A is a cross-section view of an NMOS device 400 in accordance with one or more embodiments. In some embodiments, NMOS device 400 is configured to be a high side transistor, e.g., high side transistor 210. NMOS device 400 is similar to NMOS device 300, like elements have a same reference number increased by 100. NMOS 400 also includes deep n-well 480 in substrate 402 beneath p-well 440. A source region 404 is separated into a p-type doped source region 404a and an n-type doped source region 404b.

Deep n-well 480 includes n-type dopants such as phosphorous, arsenic, or other suitable n-type dopants. In some embodiments, n-well 480 is formed by ion implantation. An implantation energy of deep n-well 480 is higher than an implantation energy for p-well 440. In some embodiments, n-well 480 is formed by epitaxially growing a layer over substrate 402. In some embodiments, the epitaxially layer is doped following growth of the epitaxial layer. In some embodiments, dopants are mixed with deposition gases during growing of the epitaxial layer. In some embodiments, a dopant concentration in deep n-well 480 ranges from about $1\times10^{12}$ ions/cm$^3$ to about $3\times10^{13}$ ions/cm$^3$.

Figure 4B:
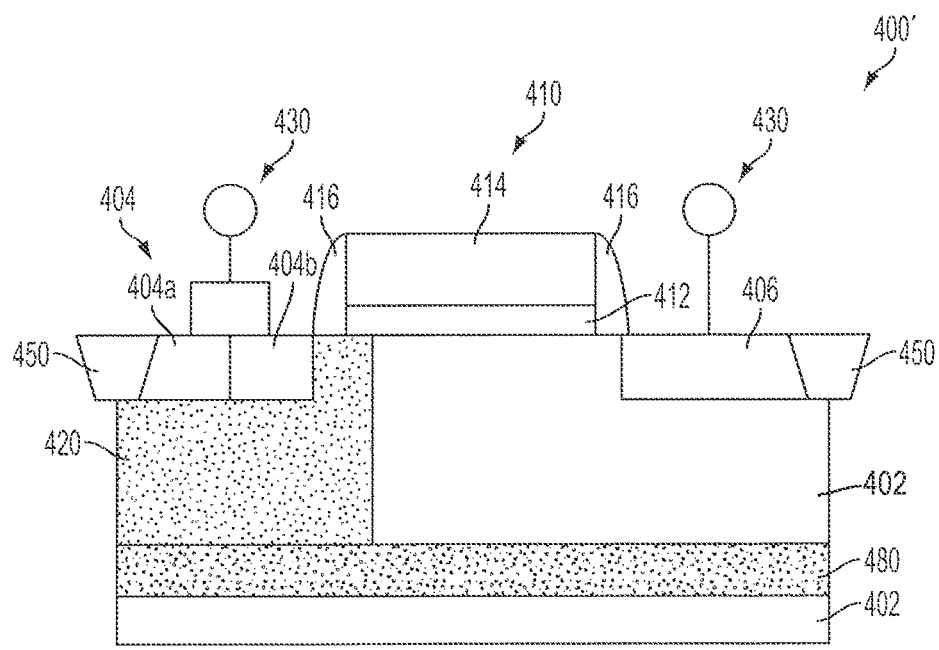

FIG. 4B is a cross-section view of an NMOS device 400' in accordance with one or more embodiments. In some embodiments, NMOS device 400' is configured to be a high side transistor, e.g., high side transistor 210. NMOS device 400' is similar to NMOS device 300', like elements have a same reference number increased by 100. NMOS 400' also includes deep n-well 480 in substrate 402 beneath p-well 440.

Figure 4C:
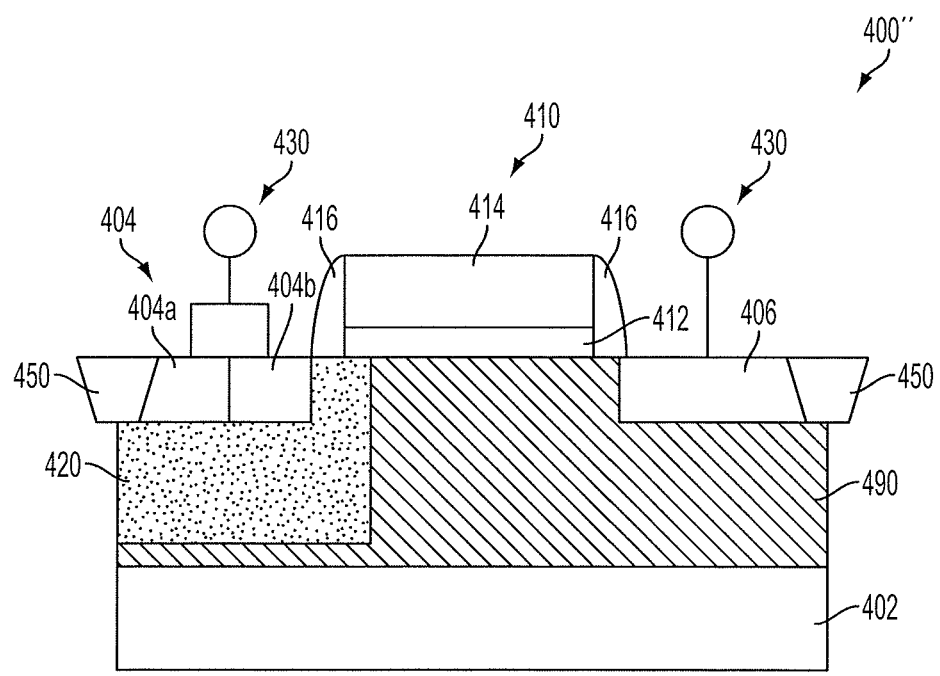

FIG. 4C is a cross-section view of an NMOS device 400" in accordance with one or more embodiments. In some embodiments, NMOS device 400" is configured to be a high side transistor, e.g., high side transistor 210. NMOS device 400" is similar to NMOS device 300, like elements have a same reference number increased by 100. NMOS 400" includes n-well 490 in substrate 402 in place of p-well 340. N-well 490 surrounds p-body 420 and drain region 406 and extends under gate structure 410. In some embodiments, n-well 490 is formed by a similar process as n-well 370.

Figure 4D:
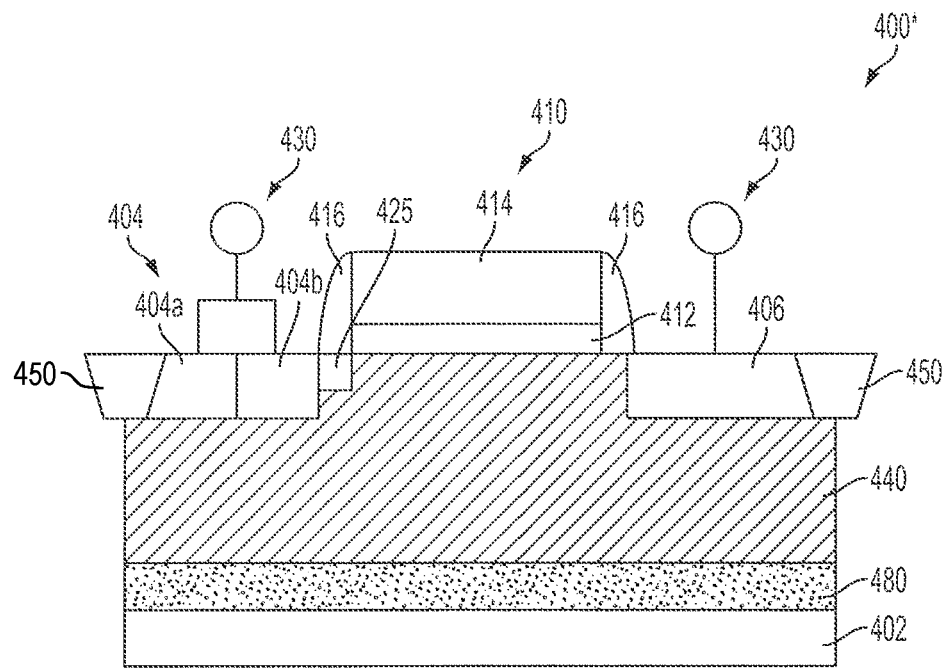

FIG. 4D is a cross-section view of an NMOS device 400* in accordance with one or more embodiments. In some embodiments, NMOS device 400* is configured to be a high side transistor, e.g., high side transistor 210. NMOS device 400* is similar to NMOS device 300", like elements have a same reference number increased by 100. NMOS 400* also includes deep n-well 480 in substrate 402 beneath p-well 440.

Figure 4E:
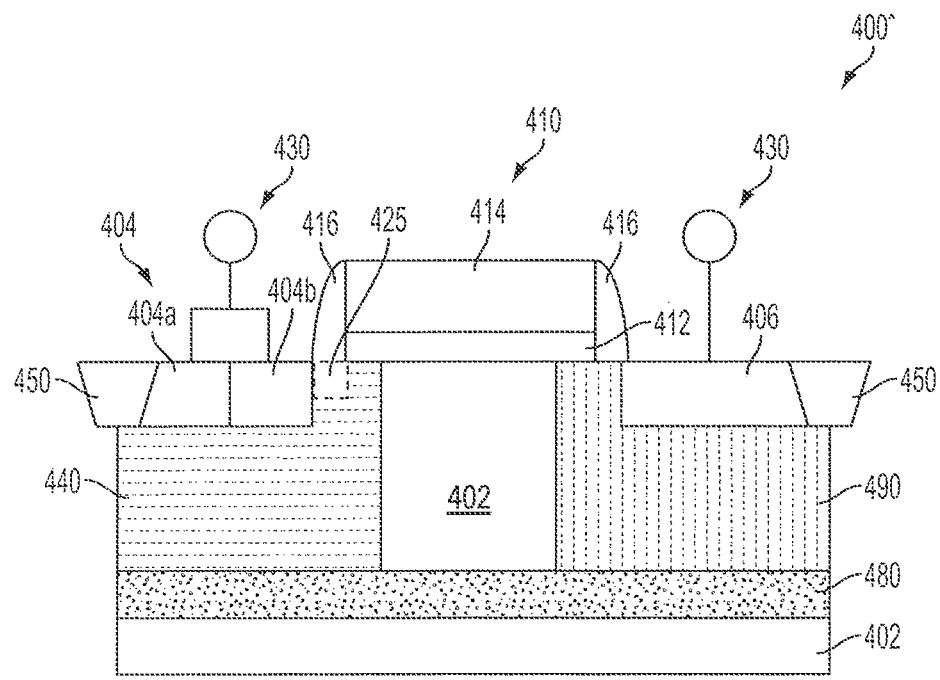

FIG. 4E is a cross-section view of an NMOS device 400^ in accordance with one or more embodiments. In some embodiments, NMOS device 400^ is configured to be a high side transistor, e.g., high side transistor 210. NMOS device 400^ is similar to NMOS device 300*, like elements have a same reference number increased by 100. NMOS 400^ also includes deep n-well 480 in substrate 402 beneath p-well 440.

Figure 4F:
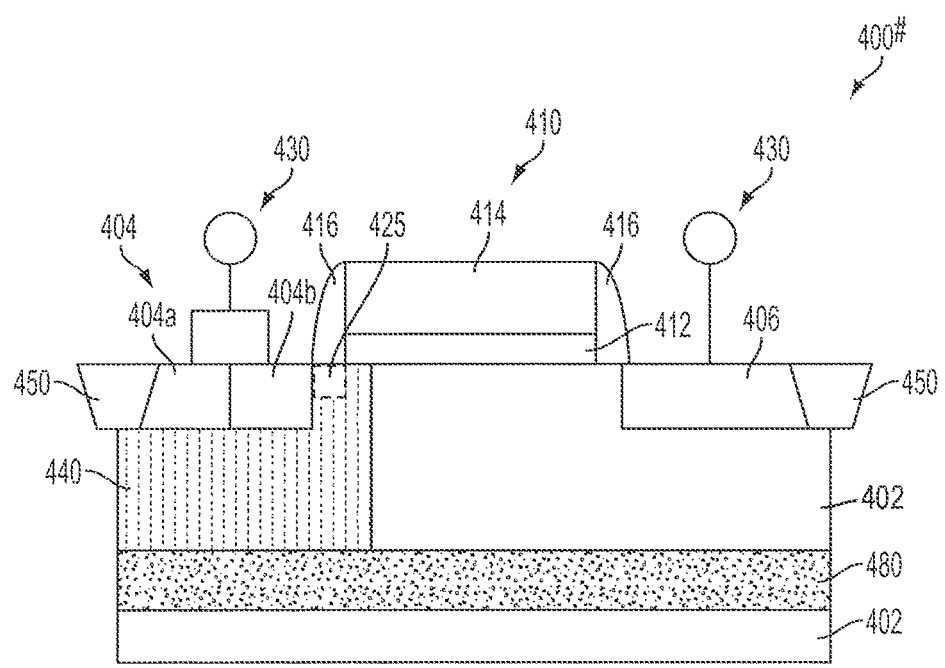

FIG. 4F is a cross-section view of an NMOS device 400# in accordance with one or more embodiments. In some embodiments, NMOS device 400# is configured to be a high side transistor, e.g., high side transistor 210. NMOS device 400# is similar to NMOS device 300^, like elements have a same reference number increased by 100. NMOS 400# also includes deep n-well 480 in substrate 402 beneath p-well 440.

Figure 5A:
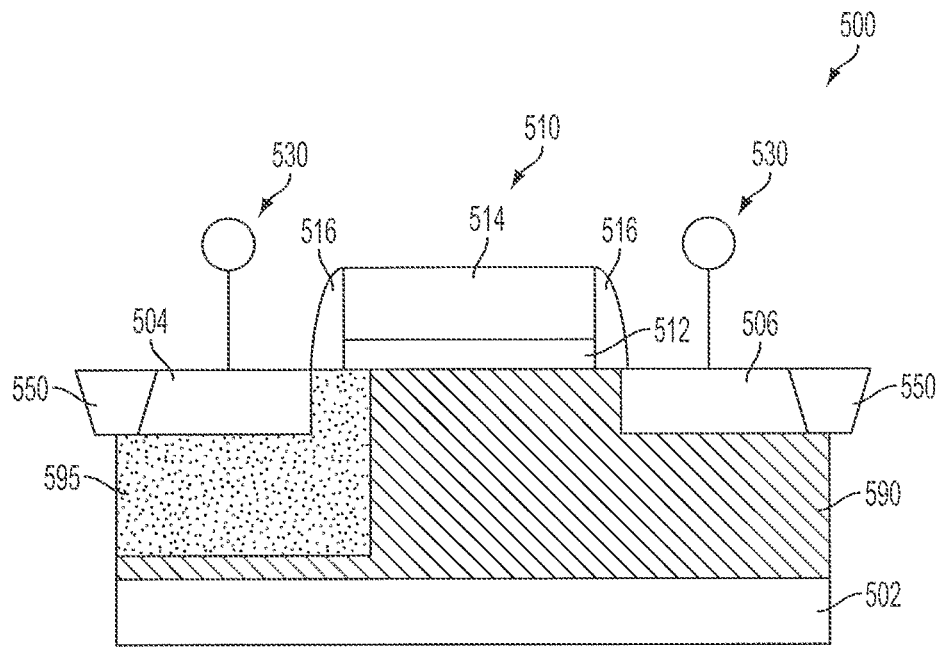
FIGS. 5A-5D are cross-sectional views of p-type MOSFET (PMOS) devices in accordance with one or more embodiments.

FIG. 5A is a cross-section view of a PMOS device 500 in accordance with one or more embodiments. In some embodiments, PMOS device 500 is configured to be a high side transistor, e.g., high side transistor 210. PMOS device 500 is similar to NMOS device 400, except dopant types for the doped body and the well are changed from p-type dopants to n-type dopants. Like elements have a same reference number increased by 100.

In place of p-type doped body 420, PMOS device 500 includes n-type doped body 595. N-type doped body 595 is formable using a self-aligned approach. In some embodiments, n-type doped body 595 is formed by ion implantation. In some embodiments, n-type doped body 595 is formed by a single ion implantation. In some embodiments, n-type doped body 595 is formed by a plurality of ion implantation process. For example, a first implant process includes doping a p-type dopant, such as boron or $BF_2$, at a power of 2 keV to 60 keV and a dopant concentration of about $5\times10^{12}$ ions/cm$^3$ to about $1\times10^{15}$ ions/cm$^3$. A second implant process includes doping a n-type dopant, such as phosphorous or arsenic, at a power of about 5 keV to about 120 keV and a dopant concentration of about $1\times10^{12}$ ions/cm$^3$ to about $1\times10^{14}$ ions/cm$^3$. A third implant process includes doping an n-type dopant, such as phosphorous or arsenic, at a power of about 10 keV to about 300 keV and a dopant concentration of about $1\times10^{12}$ ions/cm$^3$ to about $1\times10^{14}$ ions/cm$^3$. In some embodiments, n-type doped body 595 is formed using more or less than three ion implantation processes.

Figure 5B:
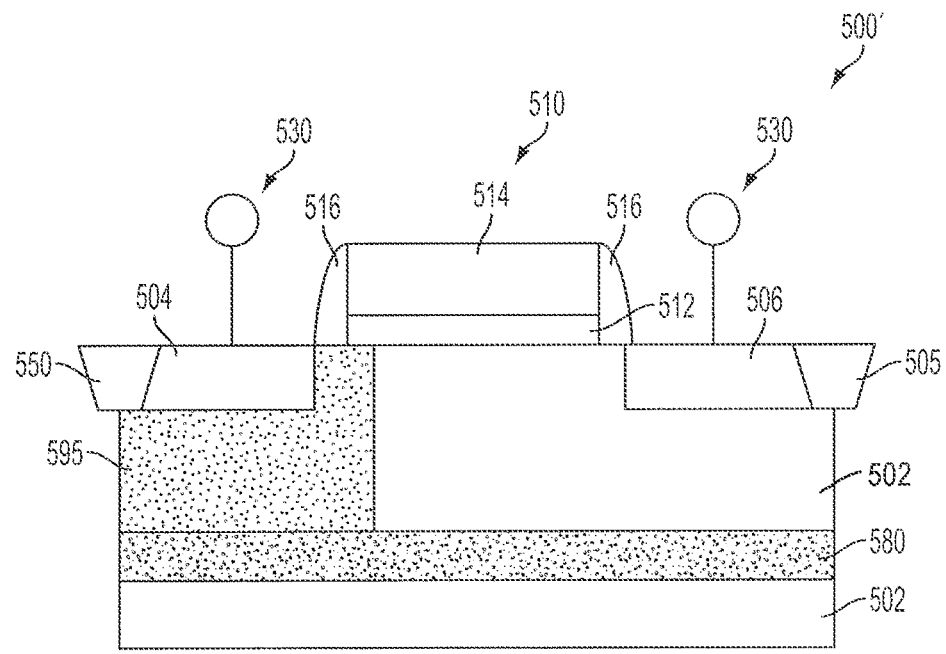

FIG. 5B is a cross-section view of a PMOS device 500' in accordance with one or more embodiments. In some embodiments, PMOS device 500' is configured to be a high side transistor, e.g., high side transistor 210. PMOS device 500' is similar to NMOS device 400', except dopant type for the doped body is changed from p-type dopants to n-type dopants. Like elements have a same reference number increased by 100.

Figure 5C:
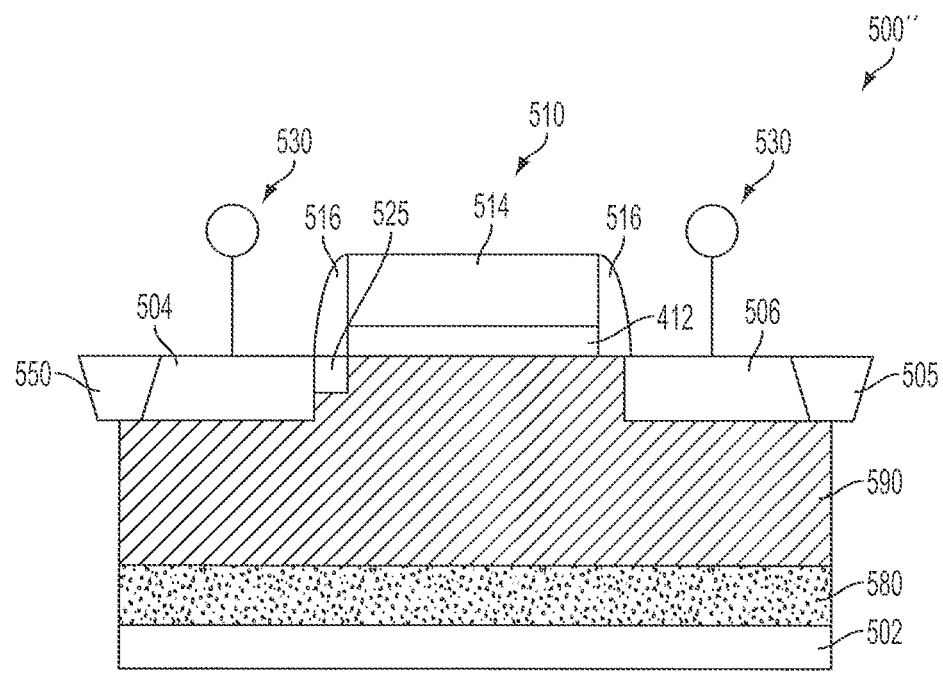

FIG. 5C is a cross-section view of a PMOS device 500" in accordance with one or more embodiments. In some embodiments, PMOS device 500" is configured to be a high side transistor, e.g., high side transistor 210. PMOS device 500" is similar to NMOS device 400", except dopant type for the well is changed from p-type dopants to n-type dopants. Like elements have a same reference number increased by 100.

Figure 5D:
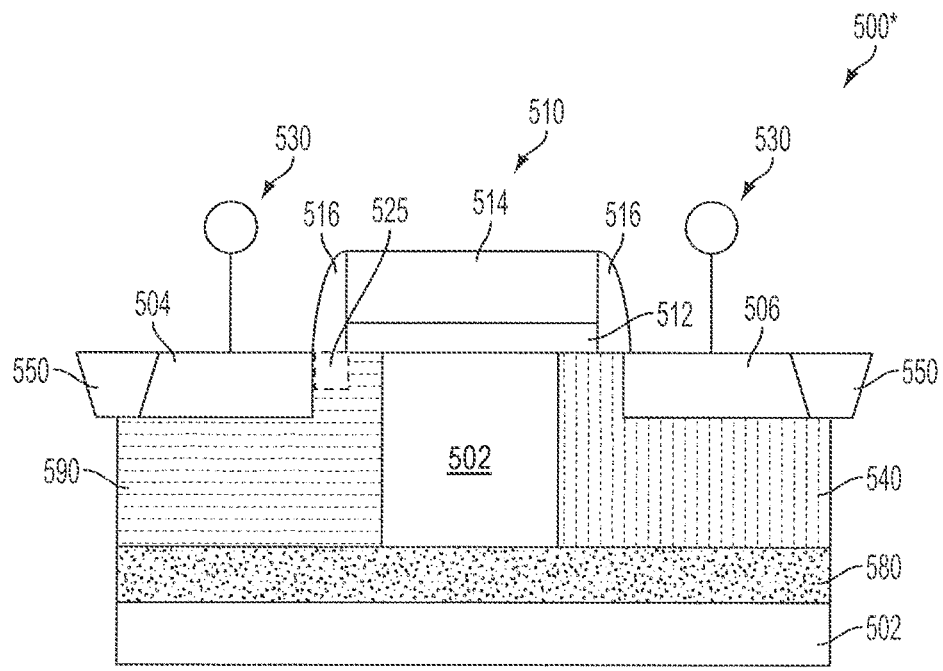

FIG. 5D is a cross-section view of a PMOS device 500* in accordance with one or more embodiments. In some embodiments, PMOS device 500* is configured to be a high side transistor, e.g., high side transistor 210. PMOS device 500* is similar to NMOS device 400*, except a location of the n-well and p-well are reversed. Like elements have a same reference number increased by 100.

Figure 6:
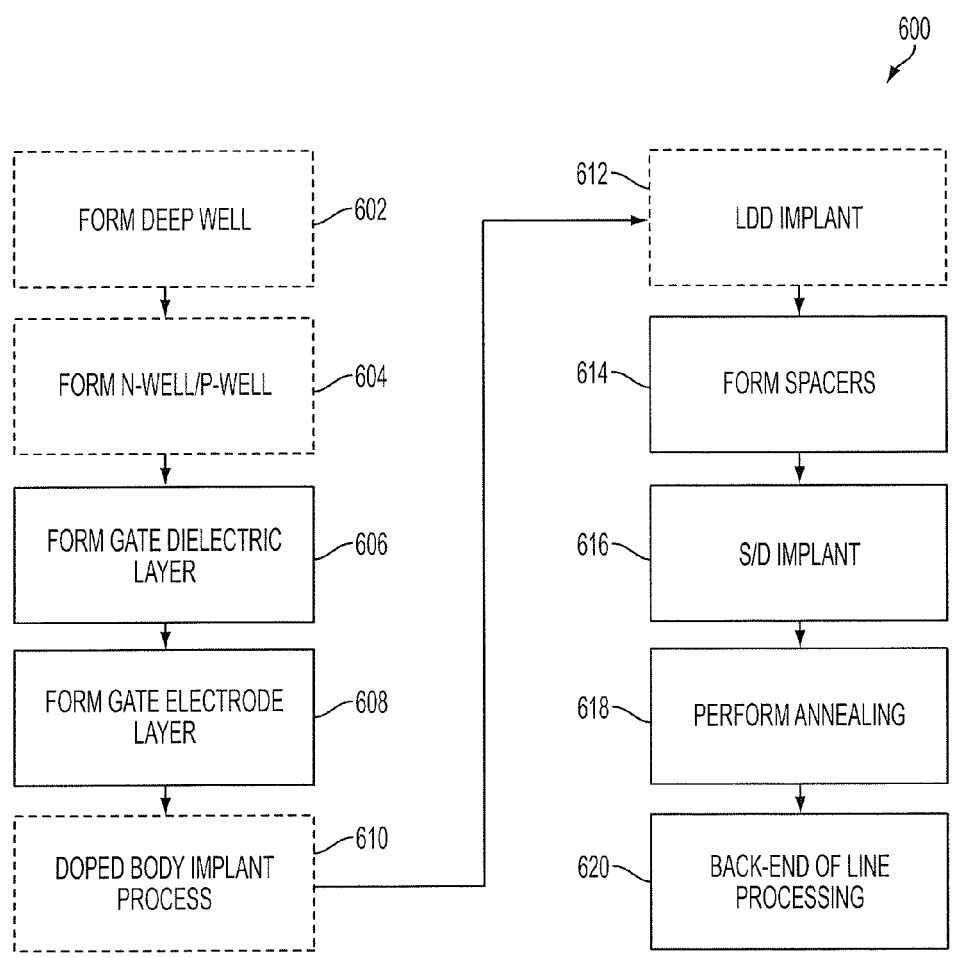
FIG. 6 is a flow chart of a method of making a MOSFET in accordance with one or more embodiments.

FIG. 6 is a flow chart of a method 600 of making a MOSFET in accordance with one or more embodiments. Method 600 begins with operation 602 in which a deep well, e.g. deep n-well 480, is formed. The deep well contains n-type dopants, such as arsenic, phosphorous or other suitable n-type dopants. In some embodiments, the deep well is formed by epitaxially growing a layer on a substrate. In some embodiments, dopants are included in the epitaxial deep well during the growing process. In some embodiments, the deep well is formed by performing an ion implantation process. In some embodiments, the ions are implanted into the substrate to form the deep well. In some embodiments, the ions are implanted into the epitaxial layer to form the deep well. In some embodiments, operation 602 is omitted. In some embodiments, operation 602 is omitted if the MOSFET is a low side transistor in a converter, such as low side NMOS 220.

Figure 7A:
FIGS. 7A-7H are cross-sectional views of a MOSFET during various stages of production in accordance with one or more embodiments.
Figure 7A:
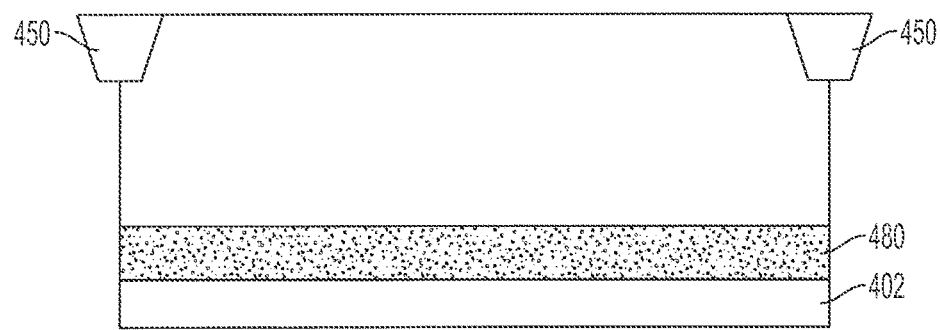

FIG. 7A is a cross-sectional view of a MOSFET following operation 602 in accordance with one or more embodiments. An ion implantation process 710 is used to form deep well 480 in substrate 402. In some embodiments, isolation structures 450 are already part of the MOSFET during ion implantation process 710.

Returning to FIG. 6, method 600 continues with operation 604 in which an n-well or p-well, e.g., p-well 440, is formed. The p-well contains p-type dopants, such as boron, BF$_2$ or other suitable p-type dopants. The n-well contains n-type dopants, such as arsenic, phosphorous or other suitable n-type dopants. In some embodiments, a single p-well or n-well is formed. In some embodiments, the single p-well or n-well extends over an entire portion of the substrate, as in FIG. 4A. In some embodiments, the single p-well or n-well extends over less than an entire portion of the substrate, as in FIG. 4F. In some embodiments, both a p-well and an n-well are formed, as in FIG. 4E. In some embodiments, the p-well or n-well is formed by epitaxially growing a layer on a substrate. In some embodiments, dopants are included in the epitaxial p-well or n-well during the growing process. In some embodiments, the p-well or n-well is formed by performing an ion implantation process. In some embodiments, the ions are implanted into the substrate to form the p-well or n-well. In some embodiments, the ions are implanted into the epitaxial layer to form the p-well or n-well. In some embodiments, operation 604 is omitted. In some embodiments, operation 604 is omitted if the MOSFET only includes a doped body, such a FIG. 4B.

Figure 7B:
Figure 7B:
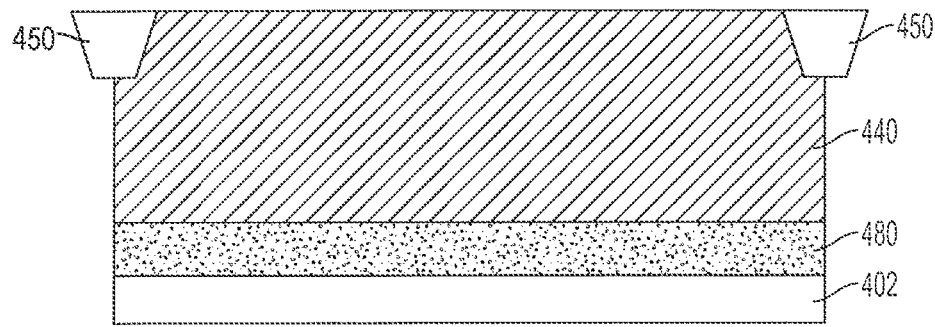

FIG. 7B is a cross-sectional view of the MOSFET following operation 604 in accordance with one or more embodiments. An ion implantation process 720 is used to form p-well 440 in substrate 402.

Returning to FIG. 6, a gate dielectric layer is formed in operation 606. The gate dielectric layer is formed over a top surface of the substrate. In some embodiments, the gate dielectric layer is formed by a thermal oxidation, nitridation, sputter deposition, chemical vapor deposition, a combination thereof, or another suitable formation process. In some embodiments, a dielectric layer is blanket deposited and then etched to form the gate dielectric layer. In some embodiments, gate dielectric layer comprises silicon oxide, silicon nitride, nitrided silicon oxide, silicon oxynitride, and high-K (for example, a K>8) dielectrics.

Figure 7C:
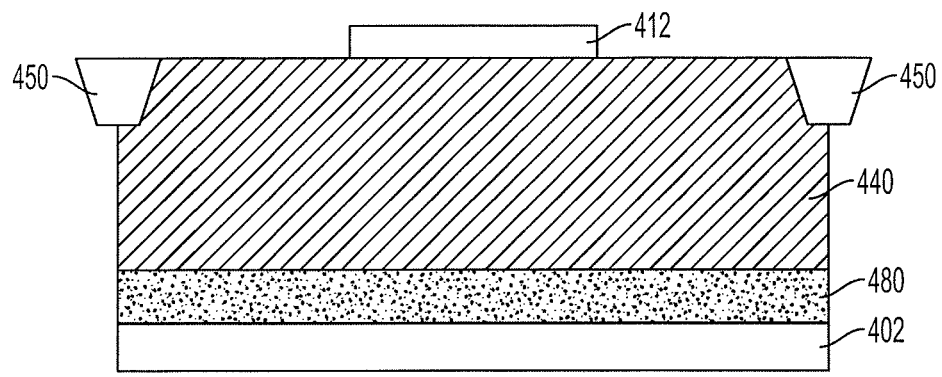

FIG. 7C is a cross-sectional view of the MOSFET following operation 606 in accordance with one or more embodiments. Gate dielectric layer 412 is formed over a top surface of substrate 402.

Returning to FIG. 6, a gate electrode layer is formed over the gate dielectric in operation 608. In some embodiments, the gate electrode layer is formed using a chemical vapor deposition, a physical vapor deposition, electroplating, or another suitable formation process. In some embodiments, an electrode material is blanket deposited and etched to form the gate electrode layer. In some embodiments, the gate electrode layer comprises doped poly silicon and/or metal. In some embodiments, gate electrode layer comprises polysilicon, doped polysilicon, amorphous polysilicon, polysilicon-germanium combinations thereof, or another suitable conductive material.

Figure 7D:
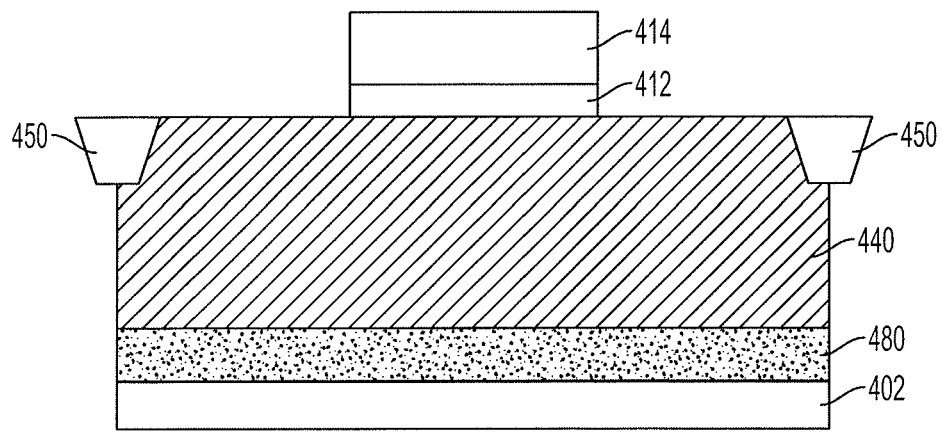

FIG. 7D is a cross-sectional view of the MOSFET following operation 608 in accordance with one or more embodiments. Gate electrode layer 414 is formed over gate dielectric layer 412.

Returning to FIG. 6, a doped body is implanted into the substrate in operation 610. The doped body is implantable using a self-aligned process. A mask layer is deposited over the substrate and the gate electrode layer. The mask is patterned so that an edge of the mask is aligned with an edge of the gate electrode layer and the gate dielectric layer. In some embodiments, the doped body is formed using a single implant process. The mask is removed following formation of the doped body. In some embodiments, the mask is removed using an ashing process or another suitable mask removal process. In some embodiments, the doped body is formed using a plurality of implant processes. In some embodiments, operation 610 is omitted. Operation 610 is omitted if the MOSFET is formed using a non-self aligned approach.

In some embodiments, the doped body is a p-type doped body. In some embodiments, the p-type doped body is formed using three p-body implant processes. The first p-body implant process includes doping an n-type dopant, such as arsenic at a power of 2 keV to 60 keV and a dopant concentration of about $5\times10^{12}$ ions/cm$^3$ to about $1\times10^{15}$ ions/cm$^3$. The second p-body implant process includes doping a p-type dopant, such as boron or BF$_2$, at a power of about 5 keV to about 120 keV and a dopant concentration of about $1\times10^{12}$ ions/cm$^3$ to about $1\times10^{14}$ ions/cm$^3$. The third p-body implant process includes doping a p-type dopant, such as boron or $BF_2$, at a power of about 10 keV to about 300 keV and a dopant concentration of about $1\times10^{12}$ ions/$cm^3$ to about $1\times10^{14}$ ions/$cm^3$. The first p-body implant is the shallowest of the implant processes while the third p-body implant is the deepest of the implant processes. In some embodiments, forming a p-type doped body implant includes more or less than three implant processes.

In some embodiments, the doped body is an n-type doped body. In some embodiments, the n-type doped body is formed using three n-body implant processes. The first n-body implant process includes doping a p-type dopant, such as boron or $BF_2$, at a power of 2 keV to 60 keV and a dopant concentration of about $5\times10^{12}$ ions/$cm^3$ to about $1\times10^{15}$ ions/$cm^3$. The second n-body implant process includes doping a n-type dopant, such as phosphorous or arsenic, at a power of about 5 keV to about 120 keV and a dopant concentration of about $1\times10^{12}$ ions/$cm^3$ to about $1\times10^{14}$ ions/$cm^3$. The third n-body implant process includes doping an n-type dopant, such as phosphorous or arsenic, at a power of about 10 keV to about 300 keV and a dopant concentration of about $1\times10^{12}$ ions/$cm^3$ to about $1\times10^{14}$ ions/$cm^3$. The first n-body implant is the shallowest of the implant processes while the third n-body implant is the deepest of the implant processes. In some embodiments, forming a n-type doped body implant includes more or less than three implant processes.

Figure 7E:
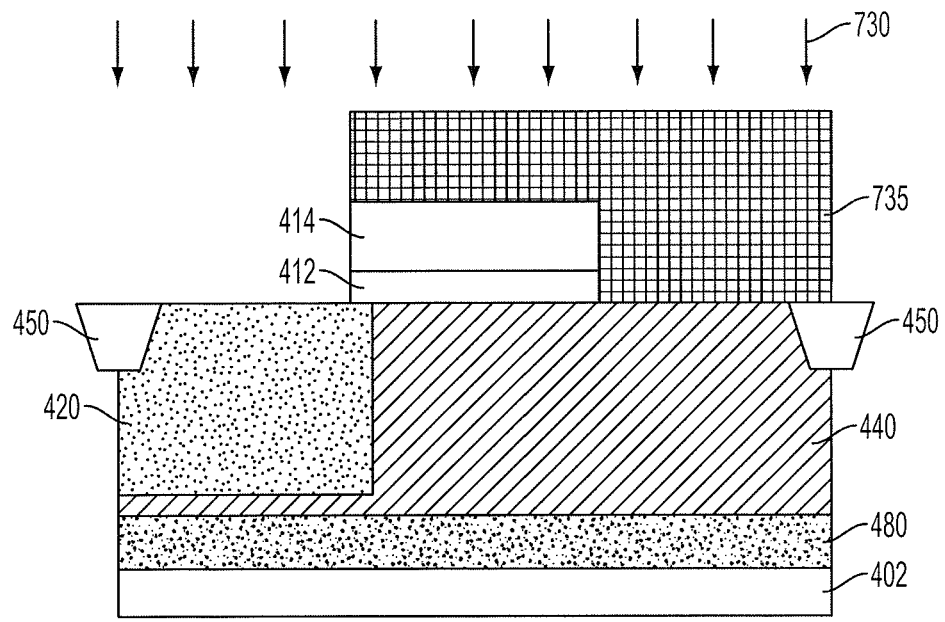

FIG. 7E is a cross-sectional view of the MOSFET following operation 610 in accordance with one or more embodiments. P-type doped body 420 is formed in substrate 402 and extends under gate dielectric layer 412.

Returning to FIG. 6, method 600 continues with operation 612 in which an LDD is implanted in the substrate. In some embodiments, the LDD is formed by an ion implantation process. A dopant type of the LDD is a same dopant type as that used in a drain region. In some embodiments, a dopant concentration in the LDD ranges from about $1\times10^{14}$ ions/$cm^3$ to about $1\times10^{17}$ ions/$cm^3$. In some embodiments, operation 612 is omitted. Operation 612 is omitted if the MOSFET is formed using a self-aligned approach. In some embodiments, operation 612 is omitted in non-self aligned approaches which have an n-well or p-well which extends over less than an entire portion of the substrate.

Figure 7F:
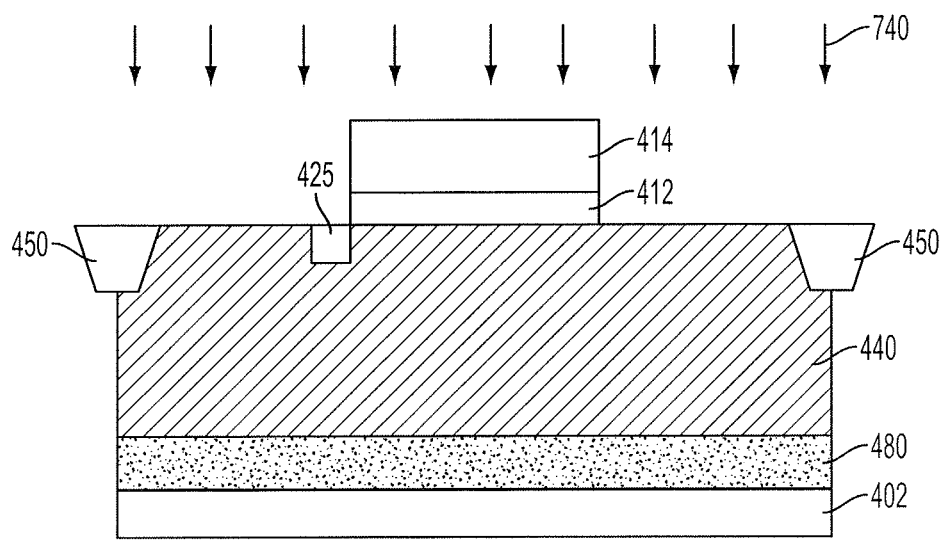

FIG. 7F is a cross-sectional view of the MOSFET following operation 612 in accordance with one or more embodiments. FIG. 7F does not include the p-type doped by of FIG. 7E because the doped body is not included in MOSFETs formed by non-self aligned approaches and LDDs are not formed in MOSFETs formed by self aligned approaches. LDD 425 is formed in substrate 402 and does not extend under gate dielectric layer 412.

Returning to FIG. 6, spacers are formed in operation 614. The spacers are formed over sidewalls of the gate dielectric layer and the gate electrode layer. In some embodiments, the spacers are formed by a wet etching process, a dry etching process, or combinations thereof. In some embodiments, the dry etching process is an anisotropic dry etching process.

Figure 7G:
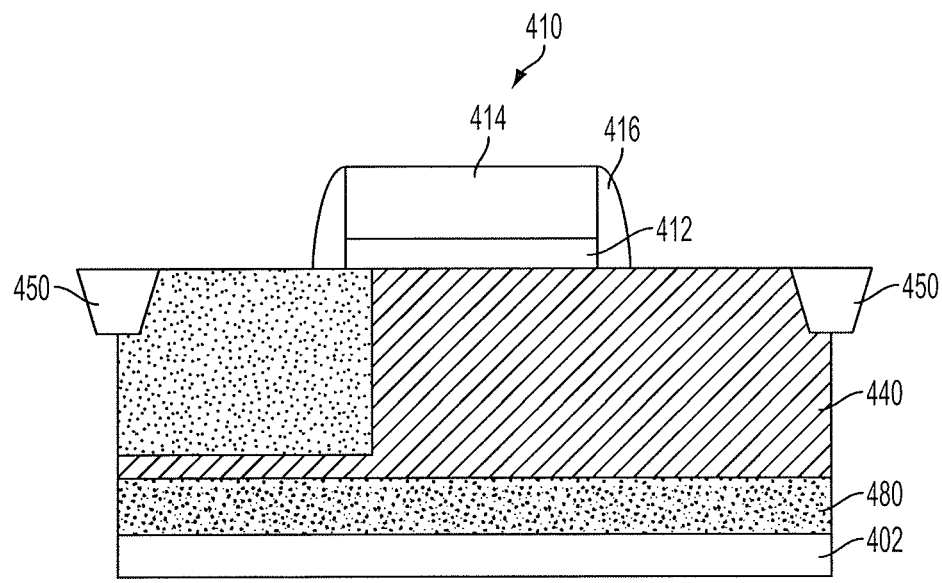

FIG. 7G is a cross-sectional view of the MOSFET following operation 614 in accordance with one or more embodiments. Spacers 416 are formed over sidewalls of gate dielectric layer 412 and gate electrode layer 414. FIG. 7G is directed to an embodiment which includes operation 610, but does not include operation 612. P-type doped body 420 extends under spacer 416 and under a portion of gate dielectric layer 412. In embodiments which include operation 612, the LDD extends under spacer 416 but not under gate dielectric layer 412.

Returning to FIG. 6, method 600 continues with operation 616 in which source and drains are implanted in the substrate. In some embodiments, the source and drain are doped with p-type or n-type dopants. For example, the source and drain are doped with p-type dopants, such as boron or $BF_2$; n-type dopants, such as phosphorus or arsenic; and/or combinations thereof. In some embodiments, the source and drain are configured for an NMOS or for a PMOS. In some embodiments, a dopant concentration of the source and drain ranges from about $1\times10^{17}$ ions/$cm^3$ about $1\times10^{19}$ ions/$cm^3$.

Figure 7H:
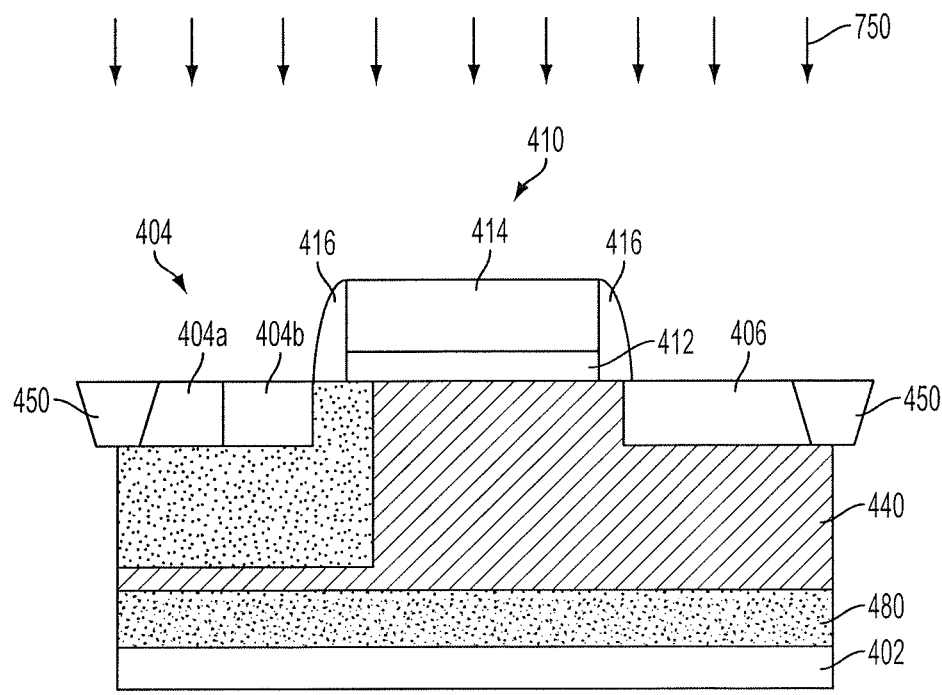

FIG. 7H is a cross-sectional view of the MOSFET following operation 616 in accordance with one or more embodiments. Source region 404 is formed in substrate 402 in p-type doped body 420. Drain region 406 is formed in substrate 402 on an opposite side of gate structure 410 from source region 404.

Returning to FIG. 6, the MOSFET is annealed in operation 618. In some embodiments, the annealing process is used to activate the dopants implanted in the previous operations. In some embodiments, the annealing process is used to facilitate movement of dopants through the substrate. In some embodiments, the anneal is a rapid thermal anneal, a microsecond anneal or another suitable annealing process. In some embodiments, operation 618 is separated into several operations which are performed after each implantation process. In some embodiments, operation 618 is separated into several operations which are performed after selected implant processes.

Method 600 continues with operation 620 in which back end processing is performed. In some embodiments, back end processing includes formation of an inter-layer dielectric (ILD) layer on the substrate. Contact holes are formed in the ILD layer. In some embodiments, the contact holes are formed by etching process, such as dry etching or wet etching, or other suitable material removal processes. Conductive contacts are formed in the contact holes to provide electrical connection to the heavily doped regions in the device. In some embodiments, the conductive contacts comprise copper, aluminum, tungsten, a conductive polymer or another suitable conductive material. In some embodiments, a conductive contact is formed in electrical connection with the gate structure. In some embodiments, additional interconnect structures are formed over ILD layer to provide electrical connections between the source and the drain and other circuitry. In some embodiments, the interconnect structures provide electrical connections between the gate structure and other circuitry.

One aspect of this description relates to a metal-oxide-semiconductor field effect transistor (MOSFET). The MOSFET includes a substrate and a gate structure over a top surface of the substrate. The MOSFET further includes a source in the substrate on a first side of the gate structure and a drain in the substrate on a second side of the gate structure opposite the first side. A surface portion of the substrate extending from the source to the drain has an asymmetric dopant concentration profile.

Another aspect of this description relates to an integrated circuit. The integrated circuit includes a converter. The converter includes a high-side transistor configured to receive a supply voltage, a low-side transistor configured to receive a reference voltage and an inductor connected between the high-side transistor and the low-side transistor. At least one of the high-side transistor or the low-side transistor comprises a metal-oxide-semiconductor field effect transistor (MOSFET). The MOSFET includes a substrate and a gate structure over a top surface of the substrate.

The MOSFET further includes a source in the substrate on a first side of the gate structure and a drain in the substrate on a second side of the gate structure opposite the first side. A surface portion of the substrate extending from the source to the drain has an asymmetric dopant concentration profile.

Still another aspect of this description relates to a method of making a metal oxide semiconductor field effect transistor (MOSFET). The method includes forming a gate structure over a top surface of a substrate. The method further includes forming a source in the substrate on a first side of the gate structure and forming a drain in the substrate on a second side of the gate structure opposite the first side. The method further includes doping a surface portion of the substrate extending from the source to the drain to form an asymmetric dopant concentration profile.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A metal-oxide-semiconductor field effect transistor (MOSFET) comprising:
   a substrate;
   a gate structure over a top surface of the substrate, wherein the gate structure has a gate dielectric layer over the top surface of the substrate;
   a source in the substrate on a first side of the gate structure, wherein a first dopant concentration is between the source and a region under the gate dielectric layer, and a depth of the first dopant concentration is shallower than a depth of the source;
   a drain in the substrate on a second side of the gate structure opposite the first side, wherein a second dopant concentration is between the drain and the region under the gate dielectric layer, and the second dopant concentration is less than the first dopant concentration; and
   a deep well in the substrate extending under the source, the gate structure and the drain.

2. The MOSFET of claim 1, wherein the gate structure comprises:
   a gate electrode layer over the gate dielectric layer;
   a spacer over a sidewall of the gate dielectric layer and the gate electrode layer adjacent to the source; and
   a spacer over a sidewall of the gate dielectric layer and the gate electrode layer adjacent to the drain,
   wherein the first dopant concentration is in a surface portion of the substrate under the spacer adjacent to the source and the second dopant concentration is in the surface portion of the substrate under the spacer adjacent to the drain.

3. The MOSFET of claim 2, further comprising a doped body in the substrate, the doped body surrounding the source and extending under the spacer adjacent to the source and a portion of the gate dielectric layer.

4. The MOSFET of claim 2, further comprising a lightly doped drain (LDD) region in the substrate, the LDD region under the spacer adjacent to the source but not under the gate dielectric layer.

5. The MOSFET of claim 2, further comprising:
   a first well having a first dopant type surrounding the source, the first well extending under the spacer adjacent to the source and under a portion of the gate dielectric layer; and
   a second well having a second dopant type opposite the first dopant type, the second well surrounding the drain and extending under the spacer adjacent to the drain and under a portion of the gate dielectric layer.

6. The MOSFET of claim 5, wherein the first well is in contact with the second well.

7. The MOSFET of claim 1, wherein the first dopant concentration is 10 to 100 times greater than the second dopant concentration.

8. An integrated circuit comprising:
   a converter, the converter comprising:
      a high-side transistor configured to receive a supply voltage;
      a low-side transistor configured to receive a reference voltage; and
      an inductor connected between the high-side transistor and the low-side transistor,
   wherein at least one of the high-side transistor or the low-side transistor comprises a metal-oxide-semiconductor field effect transistor (MOSFET), the MOSFET comprising:
      a substrate;
      a gate structure over a top surface of the substrate, wherein the gate structure has a gate dielectric layer over the top surface of the substrate;
      a source in the substrate on a first side of the gate structure, wherein a first dopant concentration is between the source and a region under gate dielectric layer, and a depth of the first dopant concentration is shallower than a depth of the source;
      a drain in the substrate on a second side of the gate structure opposite the first side, wherein a second dopant concentration is between the drain and the region under the gate dielectric layer, and the second dopant concentration is less than the first dopant concentration; and
      a doped body in the substrate surrounding the source and extending under less than an entirety of the gate structure.

9. The integrated circuit of claim 8, wherein the high-side transistor is a p-type metal-oxide-semiconductor (PMOS) transistor.

10. The integrated circuit of claim 8, wherein the high-side transistor is an n-type metal-oxide-semiconductor (NMOS) transistor.

11. The integrated circuit of claim 8, wherein the gate structure comprises:
   a gate electrode layer over the gate dielectric layer; and
   spacers over sidewalls of the gate dielectric layer and the gate electrode layer,
   wherein the first dopant concentration is in a surface portion of the substrate under a spacer adjacent to the source and the second dopant concentration is in the surface portion of the substrate under a spacer adjacent to the drain.

12. The integrated circuit of claim 11, wherein the doped body in the substrate extends under the spacer adjacent to the source and a portion of the gate dielectric layer.

13. The integrated circuit of claim 11, further comprising a lightly doped drain (LDD) region in the substrate, the LDD region under the spacer adjacent to the source but not under the gate dielectric layer.

14. An integrated circuit comprising:
a converter, the converter comprising:
- a first transistor configured to receive a supply voltage;
- an n-type metal oxide semiconductor (NMOS) transistor configured to receive a reference voltage; and
- an inductor connected between the first transistor and the NMOS transistor, wherein at least one of the first transistor or the NMOS transistor comprises:
- a substrate;
- a gate structure over a top surface of the substrate, wherein the gate structure comprises a gate dielectric layer;
- a source in the substrate on a first side of the gate structure;
- a drain in the substrate on a second side of the gate structure opposite the first side; and
- a lightly doped drain (LDD) region in the substrate adjacent to the source, wherein the substrate below the gate dielectric layer is free of the LDD region and a dopant concentration of the LDD is higher than a dopant concentration in the substrate adjacent to the drain and the gate structure.

15. The integrated circuit of claim 14, wherein the converter is a buck converter.

16. The integrated circuit of claim 14, wherein both the first transistor and the NMOS transistor have an asymmetric dopant concentration profile.

17. The integrated circuit of claim 14, wherein the first transistor comprises a deep n-well.

18. The integrated circuit of claim 14, wherein the NMOS transistor comprises a p-body, wherein the p-body extends under the gate structure.

19. The integrated circuit of claim 18, wherein the LDD region is in the p-body.

20. The integrated circuit of claim 14, wherein the source comprises a p-type doped source region and an n-type doped source region.

* * * * *